United States Patent [19]

Harada et al.

[11] Patent Number: 4,608,749

[45] Date of Patent: Sep. 2, 1986

[54] METHOD OF MANUFACTURING A SOLID-STATE IMAGE PICKUP DEVICE

[75] Inventors: Nozomu Harada; Yoshiaki Komatsubara, both of Yokohama, Japan

[73] Assignee: Kabushiki Kaisha Toshiba, Kawasaki, Japan

[21] Appl. No.: 643,232

[22] Filed: Aug. 22, 1984

[30] Foreign Application Priority Data

Aug. 23, 1983 [JP] Japan .................. 58-153761

[51] Int. Cl.⁴ .......................... H01L 27/14
[52] U.S. Cl. ........................ 29/572; 29/578; 29/577 C; 29/589; 29/571; 148/1.5; 148/DIG. 172; 148/DIG. 75; 357/24; 357/30; 357/31
[58] Field of Search ........... 29/571, 572, 578, 589, 29/577 R, 577 C; 148/1.5, DIG. 172, DIG. 75; 357/24, 30, 31

[56] References Cited

U.S. PATENT DOCUMENTS

| | | | |
|---|---|---|---|
| 3,777,061 | 12/1973 | Takemura | 357/24 LR X |
| 4,127,877 | 11/1978 | Morishita et al. | 357/24 X |
| 4,245,164 | 1/1981 | Funashashi | 357/24 X |
| 4,360,821 | 11/1982 | Tsukada et al. | 357/31 |
| 4,363,963 | 12/1982 | Ando | 357/31 X |
| 4,405,935 | 9/1983 | Bowi et al. | 357/31 |
| 4,498,013 | 2/1985 | Kuroda et al. | 357/24 LR X |
| 4,517,733 | 5/1985 | Hamano | 29/572 |

FOREIGN PATENT DOCUMENTS 58-46652  3/1983  Japan .

Primary Examiner—Brian E. Hearn
Assistant Examiner—David A. Hey
Attorney, Agent, or Firm—Oblon, Fisher, Spivak, McClelland & Maier

[57] ABSTRACT

A method of manufacturing a "two-level" solid-state image pickup device wherein a portion of a first metallic electrode electrically connected to a signal storage region is made to project to the highest position above a substrate on which it is formed. A coating of an organic insulating film is then applied to produce a flat surface. The entire surface of the organic film is then etched to expose the projections of the first metallic electrode. A second metallic electrode constituting a pixel electrode is connected to the first electrode at the exposed portion thereof.

8 Claims, 11 Drawing Figures

METHOD OF MANUFACTURING A SOLID-STATE IMAGE PICKUP DEVICE

BACKGROUND OF THE INVENTION

1. Field of the Invention

This invention relates to a method of manufacturing a solid-state image pickup device for use in a photoelectric converter employing a photoconductive film, and more particularly to a method of manufacturing such a device having a low dark current and low lag characteristic.

2. Description of the Prior Art

A "two-level" solid-state image pickup device is a device having a signal charge reading-out portion constituted by a charge-coupled device (CCD) formed on a silicon monocrystal substrate, and a photoelectric conversion portion contituted by a photoconductive film formed on the signal charge reading-out portion. The "two-level" solid state image pick-up device has many advantages, such as increased sensitivity, due to its being able to present a large aperture to incident light, and low blooming. However, there are problems with the characteristics of such a construction as will be explained below.

FIG. 1 is a cross-sectional view of a conventional two-level solid-state image pickup device. Reference numeral 11 designates, for example, a p-type Si substrate, on the surface of which are provided a first n+ layer 12a providing the CCD channel for read-out of signal charge, a second n+ layer 12b constituting a signal charge accumulation region, and n++ layer 14 provided to establish an ohmic connection between this accumulation region 12b and a first metallic electrode 17a formed for example of aluminum (Al), and a channel stopper p+ layer 13. On top of a gate oxide film, which is itself provided on top of the CCD channel 12a, there are formed CCD transfer electrodes 15a, 15b, which are made, for example, of two layers of polycrystalline silicon. A first insulating film 16a is deposited on top of these two transfer electrode layers 15a and 15b. The first metallic electrode 17a, which is connected to the n++ layer 14 through contact holes formed in the insulating film 16a, is provided so as to extend over the CCD channel. A second insulating film 16b is then deposited on this, and second metallic electrodes 17b, formed of aluminum (Al), which are pixel electrodes, are provided for each pixel region. These second metallic electrodes 17b are connected to the first metallic electrodes 17a through contact holes 20 provided in the second insulating film 16b. The contact holes 20 are formed by a reactive ion etching (RIE) of the second insulating film 16b using a patterned photoresist as a mask. On top of the second metallic electrodes 17b, a photoconductive film 18 consisting of, for example, amorphous Si and a transparent conductive layer provided by an ITO film 19 are formed.

The n+ layer 12b constituting the signal charge accumulation region, n++ layer 14, first metallic electrode 17a and second metallic electrode 17b are separately provided for each pixel. That is, the second metallic electrodes 17b define image pickup pixel regions and the potential variations obtained by the second metallic electrodes 17b as a result of the image pickup performed by the photoelectric film 18 are transmitted through the first metallic electrode 17a to the n+ layer 12b constituting the accumulation region, and are accumulated in this region as signal charges. In the view shown in FIG. 1, the channel stopper p+ layer 13 can be seen, but transfer regions which transfer the signal charges of the n+ layer 12a are of course provided for each pixel.

In such a solid-state image pickup device, the substrate surface before the photoconductive film 18 is formed must be as flat as possible. If it is not flat, this results in appreciable dark current and lag of the solid-state image pickup device, with adverse effects on the image pickup characteristics.

The reason for this is that the film quality of the photoconductive film is poorer over substrate surface irregularities as compared with what it is where the substrate surface is smooth, and this increases the number of generation and recombination centers, which cause dark current and lag. It is therefore necessary to ensure that the surface of the second insulating film 16b is as flat as possible, and that the contact holds 20 formed in the second insulating film 16b provide as few irregularities as possible.

However, in the previous method, wherein the contact holes 20 were formed by RIE using a photoresist mask, the process was very complicated because many process steps such as forming a photoresist film, patterning thereof and etching of the insulating layer by RIE were necessary. Furthermore, in the previous method in which RIE was used, the sides of the contact holes were very steep so if the second metallic electrodes 17b were made thin, breaks in the metallic film became a considerable problem. Therefore, the minimum thickness of the metallic electrodes 17b was limited to approximately 4000 Å–5000 Å, and irregularities of the substrate surface could not be minimized.

SUMMARY OF THE INVENTION

Accordingly, the objects of the present invention are to provide a method of manufacturing a two-level solid-state image pickup device wherein the aforementioned problems are solved and which has little dark current or lag.

These and other objects are achieved according to the present invention by providing a novel method wherein part of the first metallic electrode is made to project to the highest position above the substrate on which it is formed, a coating of an organic insulating film is then applied to produce a flat surface, and the entire surface of the organic insulating film is then etched to expose the projections of the first metallic electrode. One advantage of this is that the contact holes for connecting the second metallic electrodes to the first metallic electrodes are formed automatically without recourse to a photolithographic process.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1:
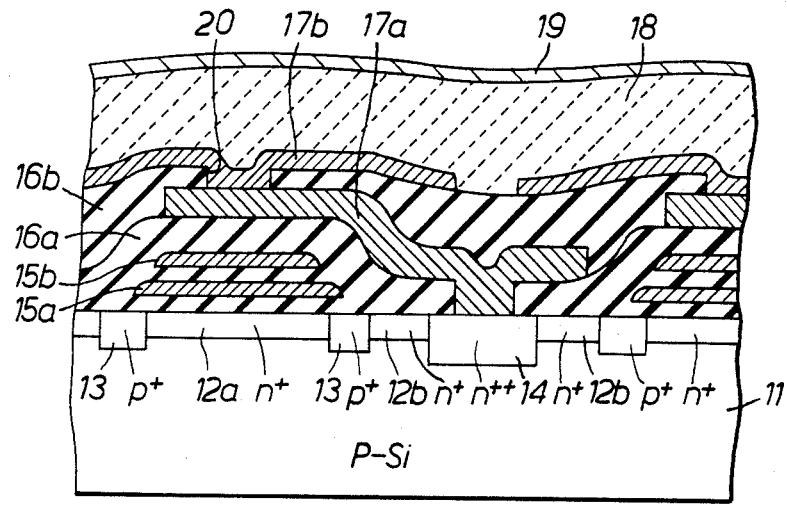
FIG. 1 is a cross-sectional view of a conventional solid-state image pickup device constructed of various layers and employing a photoconductive film as a photoelectric converter.

Referring now to the drawings, wherein like reference numerals designate identical or corresponding parts throughout the several views, and more particularly to FIGS. 2a to 2f thereof, there is shown the manufacturing stages of one embodiment according to the present invention.

Figure 2A:
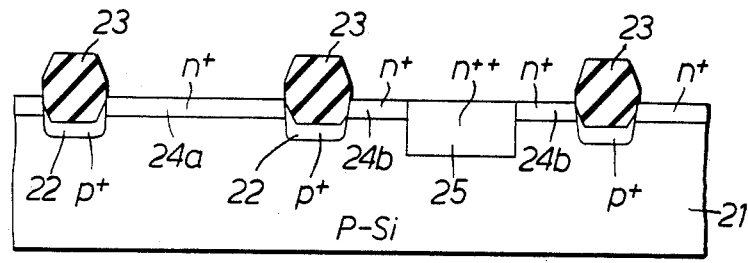
FIGS. 2a to 2f are cross-sectional showing the manufacturing stages of an embodiment of the present invention.

FIG. 2a shows the condition in which p+ layers 22 are formed as channel stopper regions of the p type silicon substrate 21, field oxide films 23 projecting upwards are formed by selective oxidation, the CCD channel n+ layers 24a is formed, a signal charge accumulation n+ layers 24b are formed, and an n++ layer 25 is formed constituting a contact region for the n+ layers 24b and metallic electrodes.

Figure 2B:
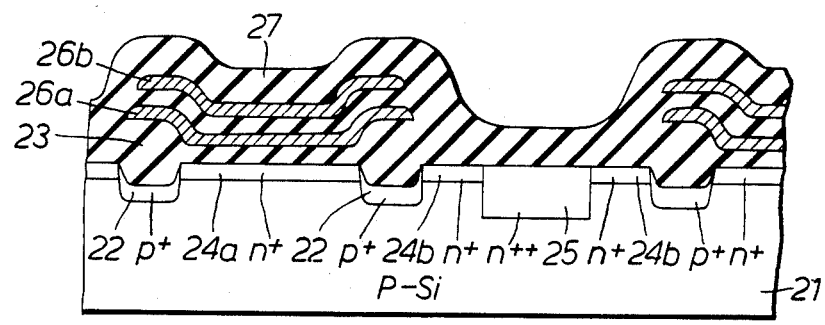

Next, as shown in FIG. 2b, on top of the gate oxide film, CCD transfer electrodes 26a and 26b are formed of polysilicon extending over the field oxide film 23, and the entire surface of the device is covered with a silicon oxide film 27, which is a first insulating film, by CVD.

Figure 2C:
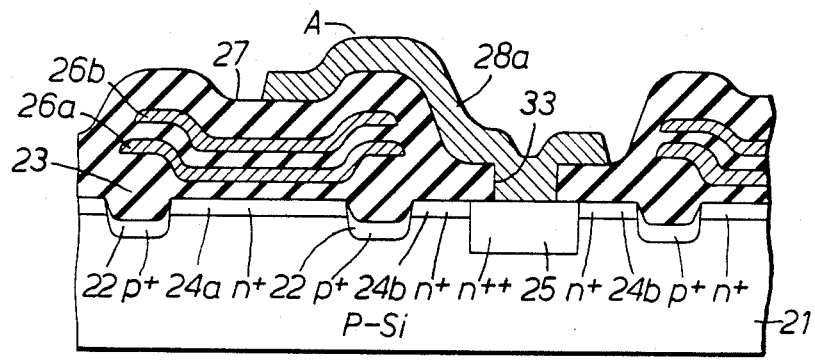

The contact holes 33 are then formed, and evaporation of Al and patterning thereof are carried out, so that first metallic electrodes 28a are formed extending over the CCD channel and contacting the n++ layer 25, as shown in FIG. 2c. As can be seen in FIG. 2c, the first metallic electrodes 28a are formed with portions A that project upwards.

Figure 2D:
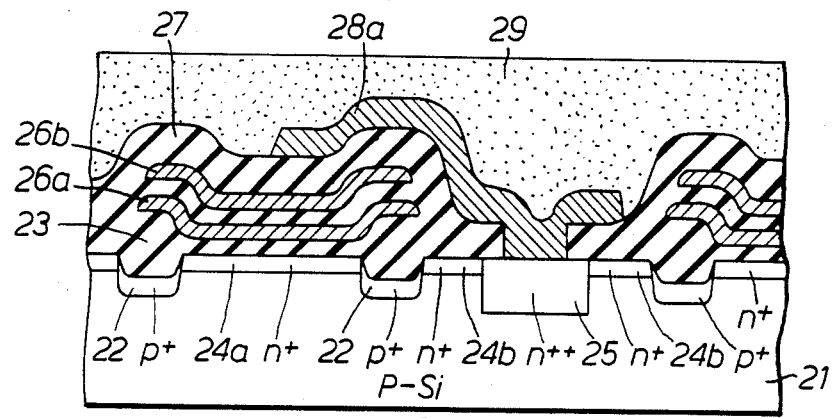

As shown in FIG. 2d, a polyimide film 29, which is a second insulating film, constituting an organic insulating film is then applied onto the substrate by, for example, a spin coating process. The use of this polyimide film 29 produces a very flat surface. The polyimide film 29 is then fixed by heating for about 30 minutes at a temperature of 400° C.–450° C.

Figure 2E:
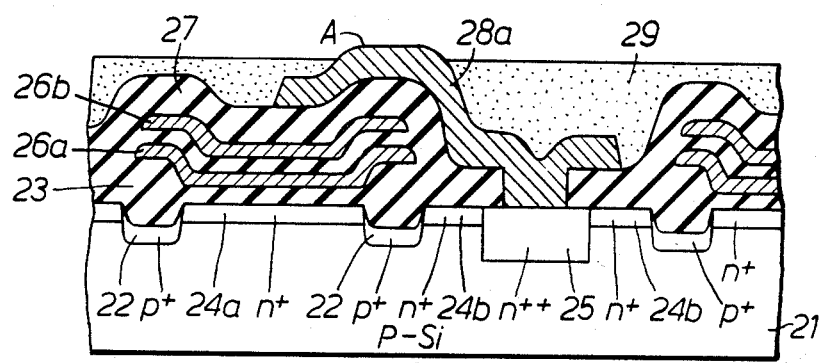

Next, as shown in FIG. 2e, the entire surface of the polimide film 29 is etched by reactive ion etching (RIE) using for example oxygen plasma, and the etching is stopped when the aforesaid projections A of the first metallic electrodes 28a are exposed. Stopping of the etching can be easily established by determining the etching time or by detecting reflected light from the first metallic electrode 28a. Contact portions for the first metallic electrodes 28a are therefore formed automatically and without requiring a masking step and in a manner giving a flat surface.

Figure 2F:
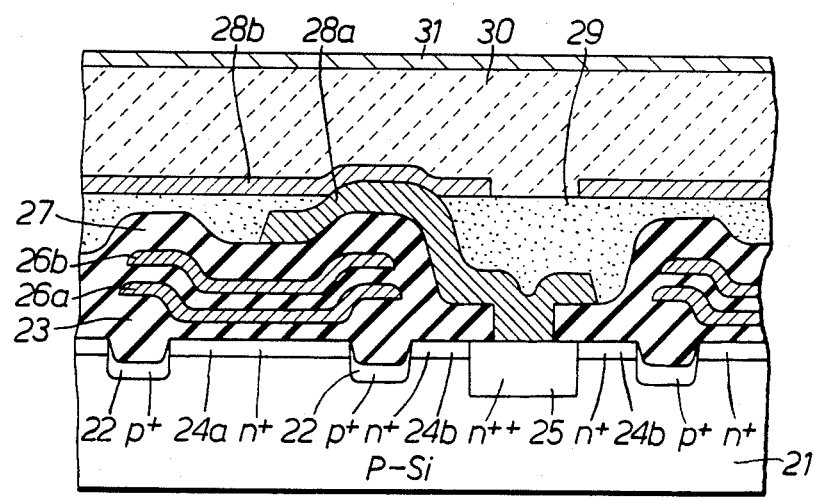

As shown in FIG. 2f, second metallic electrodes 28b formed of Al are then formed in the same manner as in the conventional device and the photoconductive film 30 and ITO film 31 are deposited over the entire surface to complete the device.

With this embodiment, the first metallic electrode 28a and second metallic electrode 28b can be electrically connected with self-alignment without patterning by photolithography, and the shape of the projection A of the first metallic electrode 28a, which constitutes the contact portion, reflects the surface shape of the first insulating film 27.

Therefore, according to the present invention, device manufacture is simplified and easy, and thin second metallic electrodes, the thickness of which is less than 1000 Å, can be used without any risk of disconnection, so the dark current of the two-level solid-state image pickup device is reduced and the lag characteristics is much improved.

Figure 3:
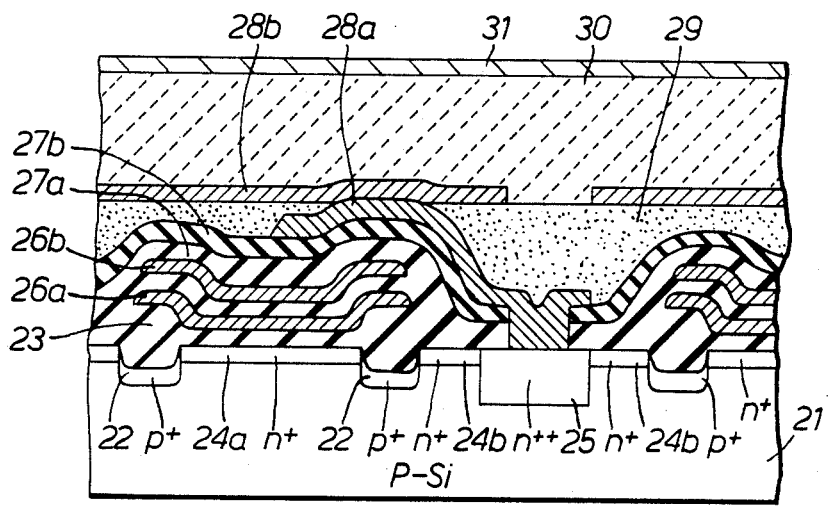
FIG. 3 is a cross-sectional view of another embodiment of the present invention.

As shown in FIG. 3, the portion constituted by the oxide film 27 can be replaced by a combination of an oxide film 27a having formed thereon a phosphor silicate glass (PSG) 27b. The PSG layer 27b is then heat-treated at for example 1000° C.–1100° C. to melt the surface thereof. As a result, the projections A subsequently formed become even smoother convexities, and therefore, a continuous smooth connection can be achieved between the projection A and the surface of the polyimide film 29. This enables the second metallic electrode 28b to be made thinner and the overall surface to be made flat, so that the photoconductive film 30 that is formed on this substrate can likewise be deposited in a uniform manner. This results in much improvements in respect of the dark current and lag characteristics. Deterioration in sensitivity can also be prevented because the photoconductive film is much more uniform over the surface of the substrate and has few trap levels.

With the embodiment of FIGS. 2a to 2f and FIG. 3, a flat surface is achieved by application of a thick polyimide film 29, but, when this method is performed using RIE, the inside wall of the reaction vessel can become very dirty. This does not directly affect the characteristics of the device, but cleaning of the inner wall of the reaction vessel is very laborious, while if it is left dirty problems arise when RIE is next carried out.

Figure 4A:
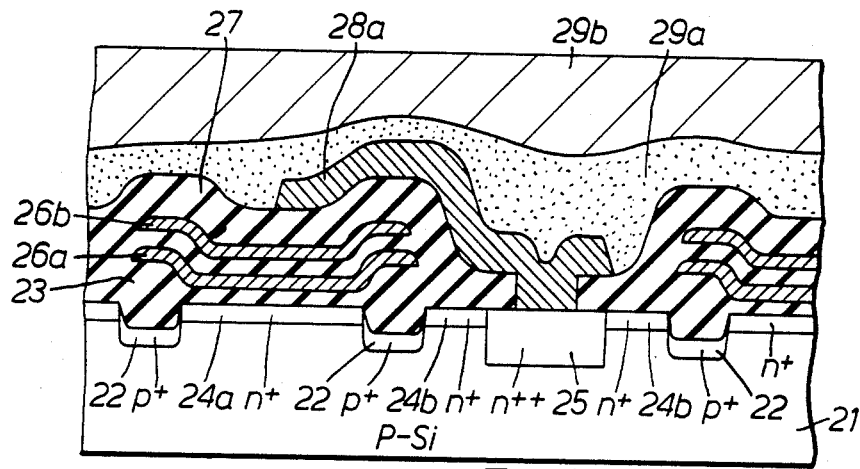
FIGS. 4a and 4b are cross-sectional views of yet another embodiment of the present invention.
Figure 4B:
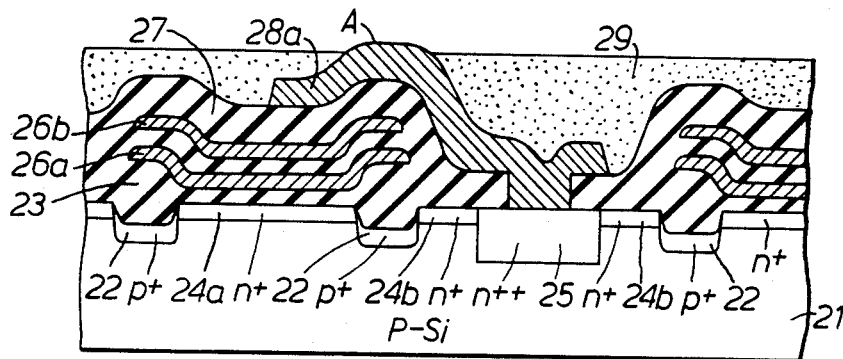

Accordingly, in the embodiment shown in FIGS. 4a and 4b, a two-stage process is performed, in which the flatness shown in FIG. 2d is achieved by first of all depositing a relatively thin polyimide film 29a sufficient to cover the projections A of the second metallic electrode 28a, then applying a photoresist film 29b onto the surface of film 29a, as shown in FIG. 4a.

The whole surface is then etched by RIE as in the preceding embodiment, to expose the projections A of the second metallic electrode 28a, as shown in FIG. 4b.

This procedure involving RIE of a photoresist has been found effective in practically eliminating soiling of the inside wall of the reactive vessel.

Figure 5:
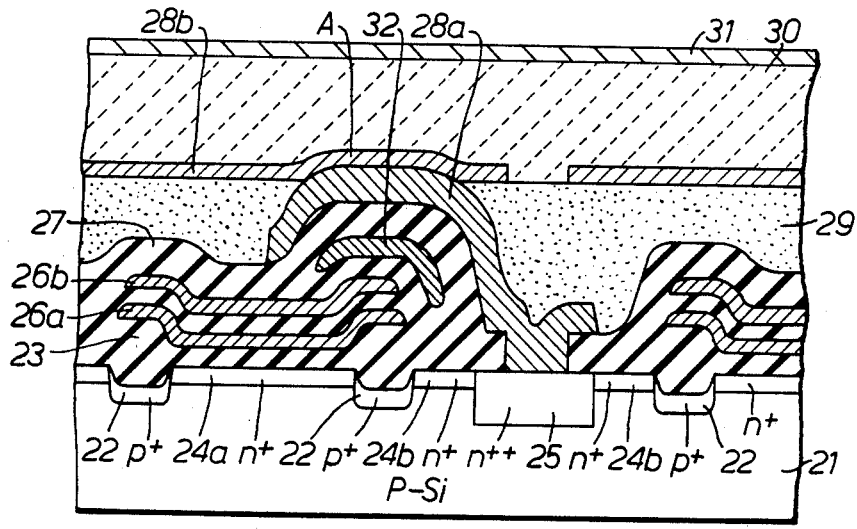
FIG. 5 is a cross-sectional view of another embodiment of the present invention.
Figure 4A:
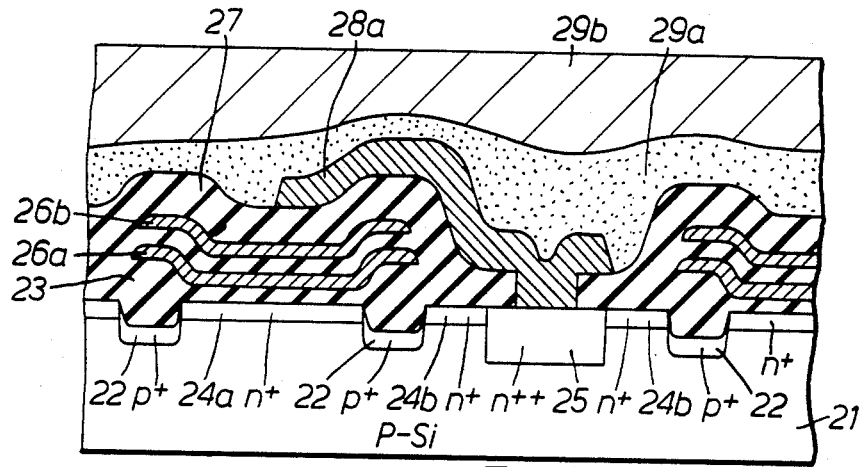
Figure 4B:
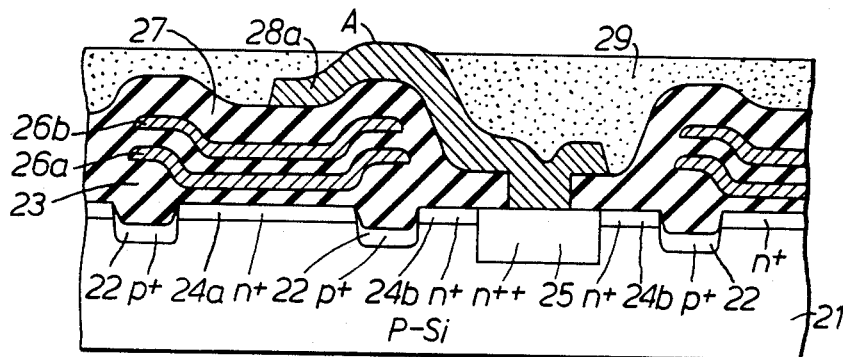
Figure 5:
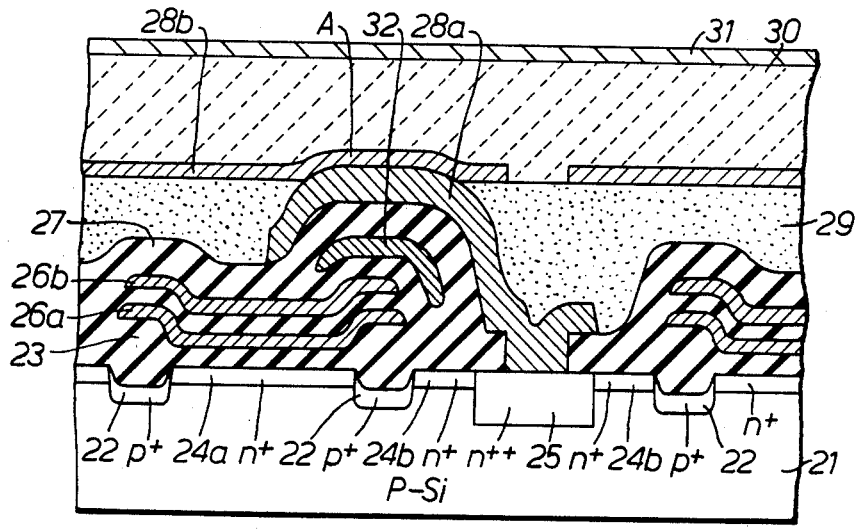

FIG. 5 shows yet a further embodiment of the present invention. It differs from FIG. 2 in that a buried electrode 32 consisting of a third polysilicon layer is formed in the oxide film 27 between the transfer electrodes 26a and 26b and first metallic electrode 28a on the channel stopper p+ layer 22. This buried electrode 32 is grounded or has a DC voltage applied thereto and provides electrostatic shielding between the transfer electrodes 26a and 26b and the first metallic electrode 28a.

In the FIG. 5 embodiment, since the third polysilicon layer constituting the buried electrode 32 is further provided underneath the projections A, these projections A project further above the rest of the surface layers, and this facilitates the process of exposing only these projections A.

This electrostatic shielding provided by electrode 32 also has the effect of preventing deterioration of the lag characteristics or unstable operation. Specifically, the storage diode constituted by the n++ layer 25 and p types substrate 21, that is connected to the first metallic electrode 28a is in an electrically floating condition during the period for which the signal charge is stored, so application of a clock pulse to the transfer electrodes 26a and 26b causes capacitative variation of the potential of the n++ layer 25. This results in some of the forming on a semiconductor substrate signal storage regions for each pixel, and signal read-out regions;

depositing a first insulating film on said signal storage regions and said signal read-out regions, including forming an oxide film on said storage regions and said signal read-out regions, forming a silicate glass layer with phosphor on said oxide film, and applying heat to melt the surface of the silicate glass layer with phosphor;

forming contact holes in said first insulating film;

forming first metallic electrodes on said first insulating film to be electrically connected to said signal storage regions through said contact holes, said first metallic electrodes hafing projections in a portion thereof;

depositing a second insulating film constituted by an organic material over the entire surface of the device as formed by the preceding step to make the surface thereof substantially flat;

etching the entire surface of said second insulating film until the projections of said first metallic electrodes are exposed;

forming on said second insulating film second metallic electrodes constituting pixel electrodes, said second metallic electrodes being connected to said first metallic electrodes at the exposed projections thereof;

depositing a photoconductive film over the whole surface of the device as formed by the preceding step; and forming a transparent conductive layer on said photoconductive film.

* * * * *